(12) United States Patent
Vaid et al.

(10) Patent No.: US 9,110,783 B1
(45) Date of Patent: Aug. 18, 2015

(54) APPLICATION-TRANSPARENT HYBRIDIZED CACHING FOR HIGH-PERFORMANCE STORAGE

(75) Inventors: Kushagra Vaid, Sammamish, WA (US); Sompong Paul Olarig, Pleasanton, CA (US)

(73) Assignee: MICROSOFT TECHNOLOGY LICENSING, LLC, Redmond, WA (US)

( * ) Notice: Subject to any disclaimer, the term of this patent is extended or adjusted under 35 U.S.C. 154(b) by 0 days.

(21) Appl. No.: 13/618,851

(22) Filed: Sep. 14, 2012

Related U.S. Application Data (63) Continuation of application No. 12/695,552, filed on Jan. 28, 2010, now Pat. No. 8,321,630.

(60) Provisional application No. 61/632,416, filed on Jun. 15, 2009.

(51) Int. Cl.
  *G06F 12/00* (2006.01)
  *G06F 12/02* (2006.01)
  *G11C 16/10* (2006.01)

(52) U.S. Cl.
  CPC .......... *G06F 12/0246* (2013.01); *G11C 16/102* (2013.01)

(58) Field of Classification Search
  None
  See application file for complete search history.

(56) References Cited

U.S. PATENT DOCUMENTS

| | | | |
|---|---|---|---|
| 6,233,648 B1 | 5/2001 | Tomita | |
| 6,467,022 B1 | 10/2002 | Buckland | |
| 6,567,889 B1 | 5/2003 | DeKoning | |
| 8,195,878 B2* | 6/2012 | Mittendorff et al. | 711/118 |
| 8,321,630 B1 | 11/2012 | Vaid et al. | |
| 2004/0093463 A1 | 5/2004 | Shang | |
| 2004/0123033 A1* | 6/2004 | Rudelic | 711/118 |
| 2006/0212651 A1 | 9/2006 | Ashmore | |
| 2007/0220202 A1 | 9/2007 | Sutardja | |
| 2008/0098164 A1 | 4/2008 | Lee et al. | |
| 2008/0155190 A1 | 6/2008 | Ash | |
| 2010/0306452 A1 | 12/2010 | Weber et al. | |
| 2010/0318734 A1 | 12/2010 | Vaid et al. | |

FOREIGN PATENT DOCUMENTS

WO    2008070173 A1    6/2008

OTHER PUBLICATIONS

The EuroSys conference report blog. http://eurosys.org/blog/. The European Professional Society on Computer Systems. Dec. 10, 2008.

* cited by examiner

*Primary Examiner* — Brian Peugh
(74) *Attorney, Agent, or Firm* — Henry Gabryjelski; Kate Drakos; Micky Minhas (57) ABSTRACT

Systems, apparatus, and computer-implemented methods are provided for the hybridization of cache memory utilizing both magnetic and solid-state memory media. A solid-state cache controller apparatus can be coupled to a host computing system to maximize efficiency of the system in a manner that is transparent to the high-level applications using the system. The apparatus includes an associative memory component and a solid-state cache control component. Solid-state memory is configured to store data blocks of host read operations. If a host-read operation is requested, the controller communicates with a solid-state cache memory controller to determine whether a tag array data structure indicates a cached copy of the requested data block is available in solid-state memory.

9 Claims, 9 Drawing Sheets

FIG. 9

US 9,110,783 B1

APPLICATION-TRANSPARENT HYBRIDIZED CACHING FOR HIGH-PERFORMANCE STORAGE

CROSS-REFERENCE TO RELATED APPLICATIONS

This application is a Continuation Application of U.S. Non-Provisional application Ser. No. 12/695,552 filed Jan. 28, 2010, and claims the benefit from U.S. Non-Provisional application Ser. No. 12/484,833 filed on Jun. 15, 2009, which was converted to Provisional Application No. 61/632,416, the disclosures of which are entirely incorporated herein by reference.

BACKGROUND

In an effort to increase the performance abilities of server-supplied storage systems to deliver information, a number of different advances have been made in recent years. For instance, the configuration of multiple drives, or disk arrays, has been utilized to leverage the scale of economy with redundant information and specialized controls. One type of disk array controller in common use among Direct Attached Storage (DAS) server systems is a Redundant Array of Inexpensive Disks (RAID) controller. This piece of hardware allows a computer to take several disk drives and make them appear as a single data source. Using this technology, a workstation or server can read or write data according to stripes across the multiple drives with the help of the controller.

Other advances have centered on operational speed of computing devices or the storage system itself. Storage improvements can be in the medium itself, in the form of internal drive algorithms used, or application enhancements. As an example, non-volatile memory or Flash memory used in a solid-state drive (SSD) is much faster than is a comparably sized conventional magnetic, rotating hard disk drive (HDD). While also requiring less power than a conventional HDD, several drawbacks exist with Flash-based technology. These include higher prices, limited capacity, and endurance issues with regard to the number of write operations that can occur. As a result, in larger-scale computing environments, increased performance has to be weighed against cost-effectiveness to create a balance in technology choices.

SUMMARY

Embodiments of the invention relate to systems, apparatus, and computer-implemented methods for the hybridization of cache memory utilizing both volatile and non-volatile memory media. A solid-state cache controller apparatus can be coupled to a host computing system to maximize efficiency of the system. The apparatus includes an associative memory component and a solid-state cache control component. The associative memory component is configured to store a tag array that associates cached and stored data blocks. The solid-state cache control component is configured to communicate with the associative memory component and a disk array control component. The solid-state cache control component is invoked in response to host read operations to minimize its limitations and accentuate its strengths.

Systems and methods for maximizing the efficiency of a hosted computing system through hybridized caching are also described. Solid-state memory is configured to store data blocks. A solid-state cache controller is configured to enable caching operations of data blocks stored on at least one solid-state memory component. The solid-state cache controller is also communicatively coupled with a plurality of magnetic disk memory components and a disk array controller configured to enable read and write operations of data blocks on the magnetic disks.

A computer-implemented method for hybridizing cache memory of a serving computer system is also described. A storage or disk array controller receives a request for either a hosted read or hosted write operation. If a hosted read operation is requested, the controller communicates with a solid-state cache memory controller to determine whether a tag array data structure indicates a cache hit or miss. If a cache hit, the copy of the requested data block is retrieved from solid-state memory. If a cache miss, the copy of the requested data block is retrieved from a magnetic disk memory component and copied to solid-state memory for future references. However, if a hosted write operation is requested, the controller communicates with a solid-state cache memory controller to determine whether a tag array data structure indicates a cache hit or miss. If a cache hit, the controller will invalidate the cache line and forward the requested write operation to the hard drive.

This Summary is provided to introduce a selection of concepts in a simplified form that are further described below in the Detailed Description. This Summary is not intended to identify key features or essential features of the claimed subject matter, nor is it intended to be used as an aid in isolation in determining the scope of the claimed subject matter.

BRIEF DESCRIPTION OF THE DRAWINGS

Embodiments are described in detail below with reference to the attached drawing figures, which are hereby incorporated by reference, wherein.

DETAILED DESCRIPTION

The subject matter of the embodiments of the invention is described with specificity herein to meet statutory requirements. However, the description itself is not intended to limit the scope of this patent. Rather, the inventors have contemplated that the claimed subject matter might also be embodied in other ways, to include different steps or combinations of steps similar to the ones described in this document, in conjunction with other present or future technologies. Moreover, although the terms "step" and/or "block" may be used herein to connote different elements of methods employed, the terms should not be interpreted as implying any particular order among or between various steps herein disclosed unless and except when the order of individual steps is explicitly described.

Embodiments of the invention relate to methods, systems, and computer storage media having computer-executable instructions embodied thereon that, when executed, perform methods in a direct access storage system for the hybridization of cache memory utilizing both volatile and non-volatile memory media. A solid-state cache controller apparatus, which includes an associative memory component and a solid-state cache control component, can be coupled to a host computing system to maximize efficiency of the system. The associative memory component may be static random access memory (SRAM) or dynamic RAM (DRAM) based. The associative memory component is configured as a tag array to store associates cached index addresses. The solid-state cache control component is invoked in response to host read and write operations and can be bypassed during cache miss operations. The solid-state cache control component communicates with the associative memory component and a storage control component.

Systems and methods for maximizing the efficiency of a hosted computing system through hybridized caching are also described. Solid-state memory is configured to store data blocks requested by a host-computing system. A solid-state cache controller is configured to discover the presence of SSDs, if present are used for caching operations. In the context of this description SSDs will be understood to be based on flash technology, or non-volatile media, although other examples of SSDs are available (such as SRAM or DRAM based solid-state components). The solid-state cache controller is also communicatively coupled with magnetic disks and a storage or disk array controller that enables both read and write operations of data blocks on the magnetic disks.

A computer-implemented method for hybridizing cache memory of a serving computer system is also described. A storage or disk array controller receives a request for either a hosted-read operation or a hosted-write operation. If a hosted read operation is requested, the controller communicates with a solid-state cache memory controller to determine whether a tag array data structure indicates a cache hit or miss. If a cache hit, the copy of the requested data block is retrieved from solid-state memory. If a cache miss, the copy of the requested data block is retrieved from a magnetic disk memory component and copied to solid-state memory for future references. However, if a hosted write operation is requested, the controller communicates with a solid-state cache memory controller to determine whether a tag array data structure indicates a cache hit or miss. If a cache hit, the controller will invalidate the cache line and forward the requested write operation to the hard drive.

Having briefly described an overview of embodiments of the invention, an exemplary operating environment suitable for implementing embodiments hereof is described below.

Figure 1:
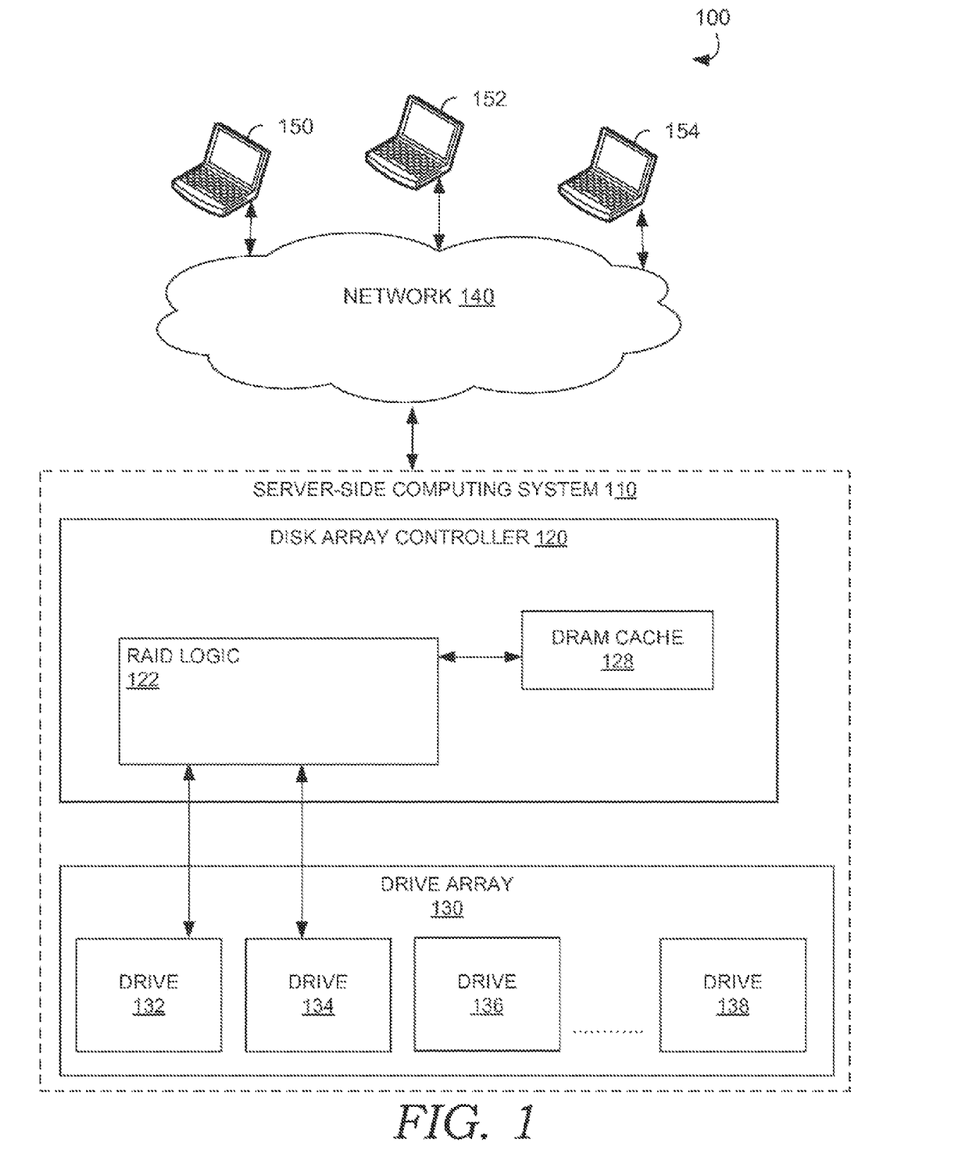
FIG. 1 is a block diagram of an exemplary direct attached storage (DAS) computing system.

Referring initially to FIG. 1 in particular, an exemplary hosted computing environment is shown as hosted computing environment 100. Computing environment 100 is but one example of a suitable computing environment and is not intended to suggest any limitation as to the scope of use or functionality of the embodiments. Neither should the computing environment 100 be interpreted as having any dependency or requirement relating to any one or combination of components illustrated or in the specific quantities shown.

Embodiments of the invention may be practiced in distributed computing environments where tasks are performed by processing devices that are linked through a communications network. Computing environment 100 generally has server-side computing system 110 and client-side computing devices 150, 152, and 154, connected via a network 140. The cloud used to represent network 140 is intended to convey the amorphous nature of the available networking methods used to connect server-side computing system 110 with client-side computing devices 150-154. Any number of potential networking schemes or architectures is available, although those used will allow devices 150-154 access to the hard drives in use with an intermediary server system. Computing devices 150-154 will be understood to be capable of requesting and receiving read and write operations to and from server-side computing system 110 through at least one of a variety of protocols (e.g., Transmission Control and Internetworking Protocols (TCP/IP)).

Generally, program modules including routines, programs, objects, components, data structures, etc., refer to code that performs particular tasks or implements particular abstract data types. Embodiments of the invention may be practiced in a variety of system configurations. Server-side computing system 110 will include at least a storage controller 120 and drive array 130. The use of hand-held devices, consumer electronics, general-purpose computers, more specialty computing devices, etc., for the client-side device(s) are all contemplated as within the scope of client-side computing devices 150-154 that can be logically coupled by a network 140. Through the use of network 140, devices 150-154 have access through direct access storage (DAS) to the drives in drive array 130. This allows greater performance as the drive array is in essence, a large computing source available to all of the computing devices attached to it via network 140.

Computing devices 150-154 typically include a variety of computer-readable media. By way of example, and not limitation, computer-readable media may comprises Random Access Memory (RAM); Read Only Memory (ROM); Electronically Erasable Programmable Read Only Memory (EEPROM); flash memory or other memory technologies; CDROM, digital versatile disks (DVD) or other optical or holographic media; magnetic cassettes, magnetic tape, magnetic disk storage or other magnetic storage devices, communication media or any other media that can be used to encode desired information and be accessed by computing devices 150-154. Memory includes computer-storage media in the form of volatile and/or nonvolatile memory. The memory may be removable, non removable, or a combination thereof.

Exemplary hardware devices include solid-state memory, hard drives, optical-disc drives, etc. Computing devices 150-154 include one or more processors that read data from various entities such as memory or I/O components. Presentation components present data indications to a user or other device. Exemplary presentation components include a display device, speaker, printing component, vibrating component, etc. I/O ports allow computing devices 150-54 to be logically coupled to other devices including I/O components, some of which may be built in the computing devices 150-154. Illustrative components include a microphone, joystick, game pad, satellite dish, scanner, printer, wireless device, etc.

Computing devices 150-154 are understood to be sending requests when they are in communication with storage controller 120. This data comes as a data stream and includes an LBA number (i.e. a "physical address" on a drive), an operand size that denotes the size of the data block request, and an operation type consisting of a host read operation or a host write operation. Those data blocks that are requested in host read operations are returned by the disk array controller to the requesting computing device. One aspect of a direct attached storage system is its ability to deliver large amounts of data to devices or workstations, limited only by the bandwidth available to deliver that information simultaneously.

Storage controller 120 is understood to be a component used to read and write data blocks across the separate drives of drive array 130. Examples of storage controllers include super input-output (I/O) controllers and serial advanced technology attachment controllers. Another type of exemplary storage controller 120 is a disk array controller, such as a RAID controller. A RAID controller will have logic modules or components enabling devices 150-154 on network 140 to read or write data blocks to one or more of drives 132-138 in drive array 130. A typical RAID controller will have a cache memory, shown on storage controller 120 as cache memory 128. The cache memory is used to store accessed or written data blocks based on principle of locality: temporal locality (locality in time) or spatial locality (locality in space) in order to improve overall system performance. By keeping frequently accessed items in a smaller, more efficient memory, the frequently accessed items can be transmitted to requesting computing devices 150-154 more quickly.

With reference to FIG. 1, drive array 130 can be a number of configurations of drives that enable redundant hosted computing. Drives 132, 134, 136, and 138 are part of drive array 130. This should not be construed to limit the described embodiments to four drives in a hosted system, but is intended to provide an exemplary system. Fewer or more drives may be used to complete the drive array 130. Drive array 130 could be a disk enclosure or a plurality of drives on a server chassis. This should not be construed as a limitation or a requirement, as it is just exemplary of possible types of drives and architectures with which the embodiments of the invention are operable.

There are different types of drives that can be used as part of drive array 130. Conventional hard disk drives (HDDs), or magnetic drives, offer reasonable prices for the amount of storage and are available with large capacities. They are reliable for both read and write operations. Solid-state drives (SSDs) on the other hand, cost more but are more power efficient and offer much faster latency than HDDs. SSDs are also limited in the number of write cycles that can cause them to degrade. Other reasons, such as limited high-end capacity and high cost, however, have made these drives more cost-prohibitive.

The use of both types of drives is possible. However, if implemented on the application level to take advantage of the different strengths and weaknesses of these drives, the hybridization becomes very complex. This type of approach requires mapping of data usage patterns. So-called "hot data" or that which is used often, would be cached because of its frequent reads, while so-called "cold data" would not be written to solid-state storage to save the host write operations (because of the data endurance issues of flash-based memory). Otherwise, the high operational speed of the solid-state data is not used to its fullest to make the system more efficient. Application changes could be significant without any guarantees of the effectiveness such run-time identification and migration could actually generate.

As will be described in further detail below, a strictly conventional cache memory on a storage controller offers faster speed but at significant higher cost and power consumption. In addition, the limited spacing on the PCI-based adapter may limit the size of the memory cache. But, the use of a hybridized cache through the hardware of the system has advantages that will be apparent. For instance, this implementation would be transparent to any new or legacy software release. Therefore, it would not require software changes. Instead, the server administrator could populate the system with memory of differing types and the controller hardware could determine how to best allocate capacity and available performances. The firmware stack is modified to implement these differences. By utilizing a solid-state cache controller apparatus that differentiates multiple media types, read/write speeds, and storage characteristics, the apparatus can determine a cache store and persistent store hierarchy. Because these differences are determined by the storage component characteristics, the determination is not exposed to the application.

As included in the foregoing and following descriptions, computing systems arranged according to these basic configurations will be generically referred to as hosted computing, server computing, or enterprise computing systems. Through the remainder of this document and in the drawings, like numbering will be used where possible. Those components that correspond to previously described elements and features will be noted as such and be considered substantially similar in description. Those components that depart from previous description will be specifically noted.

According to embodiments of the present invention, within a hosted computing environment, a solid-state cache controller apparatus can be used to increase the efficiency of DAS access for hosted-read operations. DAS access can be achieved through any one of several conventional protocols, including Advanced Technology Attachment (ATA), Serial ATA (SATA), Small Computer System Interface (SCSI), or Serial Attached SCSI (SAS). This list is meant to be illustrative rather than exhaustive and should not be construed as a limitation on the scope of the embodiments of the invention. Through the several described embodiments, the hybridization apparatus has two primary components, an associative memory component and a solid-state cache control component. One or both components can be in logical communication with a disk array controller, depending on the configuration utilized, or may be a part of such an integrated controller.

In some embodiments, the solid-state cache control component is a part of the disk array control logic. The solid-state cache control component could be embedded logic within a RAID control logic component. In other embodiments, the solid-state cache control component could be part of a RAID on Chip (ROC) component. The solid-state cache control component is configured to communicate with the associative memory component (AMC) and a disk array control component. The solid-state cache control component can detect multiple media types with the use of protocol-based discovery methods or with other ways of detecting component characteristics. As a result, the apparatus can accommodate different manufacturing technologies and latencies, allowing varied components to be mixed together in a DAS system. This also enables the system to be adapted with the controller, without requiring application or driver modifications.

It would be possible to have the solid-state cache control component perform both read and write operations. However, to better optimize the strengths of SSD technology (namely by avoiding the shortened life cycle of SSDs caused by write operations), embodiments of the invention are optimized for caching of host-read operations. Host-read operations are those instructions that take place when data blocks are to be read from an HDD. Therefore, these instructions include accessing data blocks from an HDD that are to be written to a solid-state cache memory component on a first read access or those that are to be read from a solid-state cache memory component because they were previously accessed (and written to the cache).

Like the solid-state cache control component, the associative memory component can be a separate component on a disk array controller or it may be embedded within the controller. Regardless of the location, the associative memory component can be configured as a tag array to store cache indexing representing data blocks stored on a solid-state cache memory component (SSD). Thus, when a read operation has been requested, the solid-state cache control component can determine if there is a "hit," i.e. if the data block has previously been stored. If the tag array does not include the data block for which the read operation was requested, the data block can be fetched from the HDD and cached. The tag array subsequently updated to reflect the newly stored data block.

The implementation of a solid-state control component and AMC can borrow concepts from central processing unit (CPU) architecture. For the exemplary case, main memory and on-chip cache will be equivalent to HDD and SSD, respectively. A native SSD block size can be utilized as the cacheline size in this system. If each HDD address is of a particular size, then each SSD cacheline represents the native SSD block size divided by the HDD address size. The RAID stripe size can be selected as the same as the SSD block size for the purposes of this example. The max storage capacity of the HDD system can be derived by multiplying the width of the address size.

The physical address of the store stream needs to be mapped into the SSD data cache. This can be done via the cache TAG array on the disk array controller, i.e., either in communication with the RAID control component or embedded within that controller. The TAG array can be a conventional n-way set associative cache array and store the metadata information for how the incoming physical addresses are to be associated to SSD cachelines. The TAG array can have a field for the state to indicate whether the entry is valid or invalid.

When a hosted operation is received by the disk array controller, the cache functions as a typical set-associative cache design. The disk array controller can look up the cache set and a tag match can be performed on all ways with the value in the physical address. The validity of the state field is checked for a cache hit or miss. The cache entry which contained the hit is recorded as such and this will be used for looking up the actual data blocks which are stored in the SSD disk array. The one or more SSDs are treated as the data cache array. These cachelines are logically numbered starting from zero. The cacheline address can be derived for read/write based on incoming physical address.

Because a tag lookup by the RAID controller requires a physical address, the physical address is derived for lookup. The RAID controller, however, is agnostic to the algorithms which are performed within the SSD drive. From the perspective of the RAID controller, the range of physical addresses represents the entire range of the SSD drive arrays. This permits independent optimization of the SSD without dependencies on the controller development.

Figure 2:
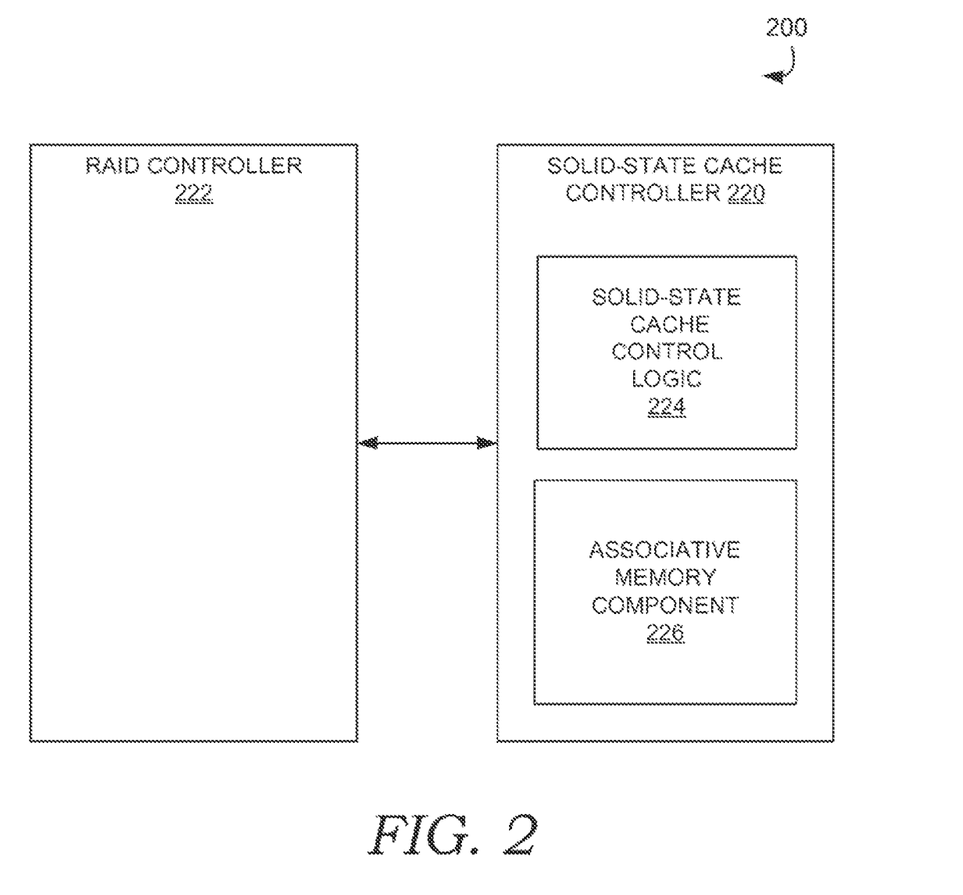
FIG. 2 is a block diagram of solid-state cache controller apparatus according to an embodiment of the invention.

With reference now to a FIG. 2, a block diagram of a solid-state cache controller apparatus 220 is shown according to described embodiments of the invention. Apparatus 220 includes a solid-state cache control logic component 224 and an associative memory component 226. Solid-state cache control apparatus 220 is shown in communication with a RAID control component 222. However, one or both of solid-state cache control component 224 and associative memory component 226 can be a part of RAID controller 222.

One manner in which the described solid-state cache controller apparatus can be implemented is through a drive-situated solid-state cache that is not located on the disk array controller. In this scenario, the RAID controller logic and the associated solid-state cache control logic is located on the disk array controller. Also located on the disk array controller is the standard DRAM cache that is used conventionally, and will remain in use as first level of storage caching. The disk array controller will also contain the TAG RAM for the solid-state cache component that will be used as second level caching. This is a cache for host-read operations to be stored and/or accessed from the SSD.

Using a drive-situated solid state cache, one or more large-form-factor or small-form-factor SSDs are located in proximity with the HDDs. Many conventional systems will use a drive enclosure to situate a group of drives together. For exemplary purposes only, a drive rack with 12 drives could be coupled to a RAID controller. Using the drive-situated solid-state cache as one drive in the rack, 11 HDDs could be used in conjunction with the single SSD.

By using large-form-factor/small-form-factor SSDs, it should be understood that these are drives on the scale comparable, if not equal, to the similar HDDs. As an example, large-form SSDs can support more than 100 Gigabytes (GB). Thus, the SSD will appear to the control logic as a hard drive for which it is used as data cache memory.

Figure 3:
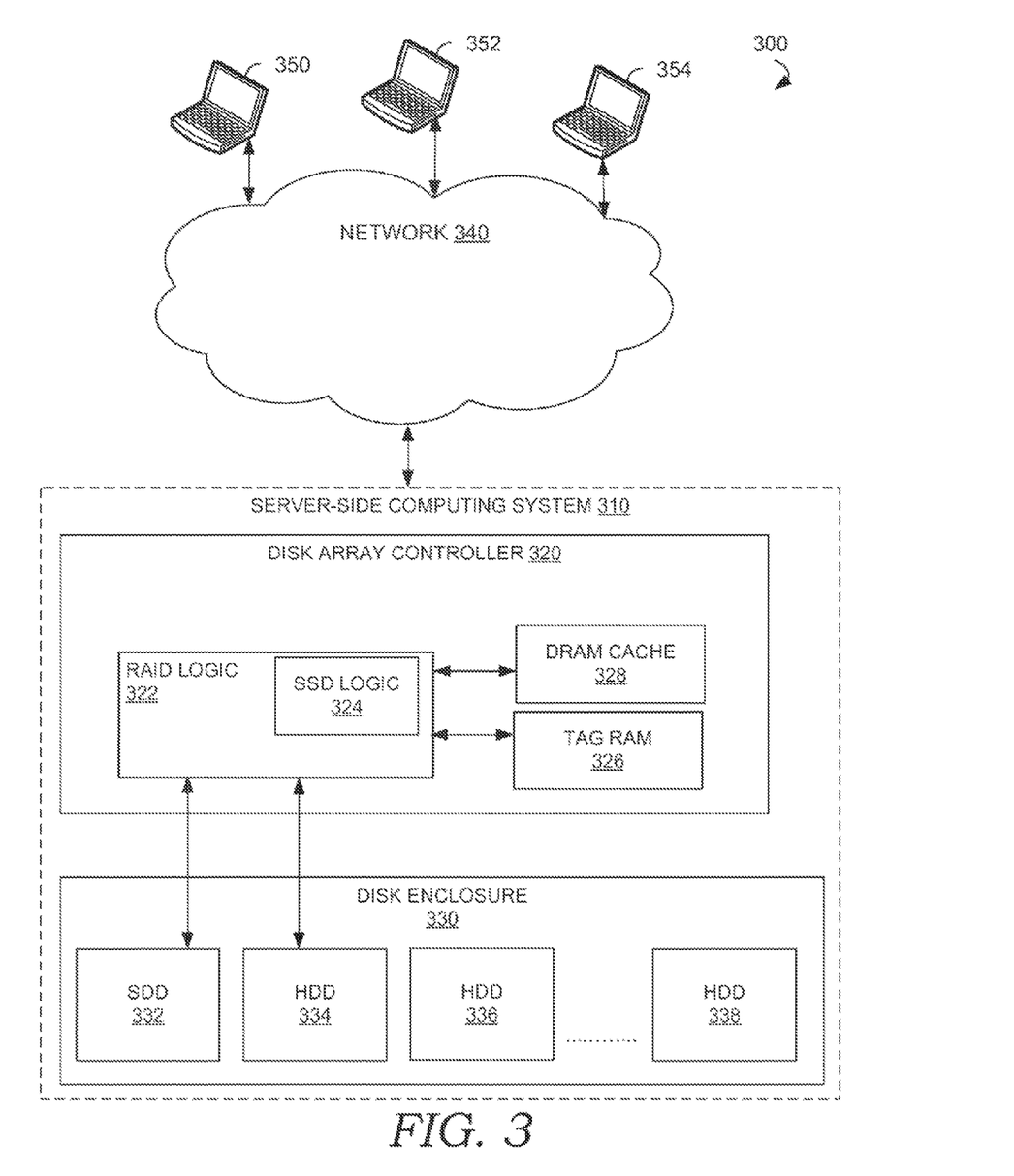
FIG. 3 is a block diagram of an embodiment of the invention with a two-level, drive-situated, large-form-factor SSD cache.

Turning now to a FIG. 3, a drive-situated hybridized cache system 300 is shown according to an embodiment of the invention. Drive-situated system 300 includes a server-side computing system 310 that is substantially similar to server-side computing system 110. There is a storage controller 320, and a disk enclosure 330 that are again similar to counterpart elements in FIG. 1, as are computing devices 350, 352, and 354 connected to server-side computing system 310.

Storage controller 320 is shown in greater detail than controller 110 in order to describe the disk array control to a finer level of granularity. There are three individual components shown in controller 320—RAID controller 322, TAG RAM 326, and DRAM cache 328. Each of TAG RAM 326 and DRAM cache 328 is in communication with RAID controller 322. DRAM cache 328 is the conventional first-level storage cache memory used for host-read operations and host-write operations. Due to cost and space constraints, the first-level storage cache sizes can be less than 1 GB. TAG RAM 326 is used for SSDs and is substantially equivalent to associative memory component 226 of FIG. 2. TAG RAM 326 is in communication with RAID controller 322 and some or all of its associated subcomponents when a host read operation takes place.

A disk enclosure 330 is shown that has a solid-state drive 332 and a plurality of hard disk drives numbered 334 to 338. Solid-state drive 332 can be located remotely, e.g., several meters away from storage controller 320. The remote location is possible because the operational efficiency gained more than offsets any inefficiency incurred because of increased latency (introduced by the distance instructions must travel) between solid-state drive 332 and storage controller 320.

A subcomponent of RAID controller 322 shown in FIG. 3 is solid-state cache logic component 324. This represents the modified portion of RAID controller 322 that allows TAG RAM 326 to store tags associating the cached data blocks in solid-state memory component 332 with the physical addresses for which they are cached from conventional storage ranging from HDD 334 to 338. While solid-state cache logic component is shown in the figure as a subcomponent of RAID controller 322, this is not the only implementation possible. Solid-state cache logic component 324 could be manufactured as a separate controller communicatively coupled with an existing RAID controller 322. Likewise, a centralized controller can be developed that operates to manipulate both a solid-state cache logic controller 324 and a RAID controller 322.

The drive-situated solid state cache is not the only configuration in which the embodiments of the invention may be implemented. A controller-situated, small-form-factor SSD cache is also within the scope of the embodiments of the invention. In this instance, the cache is not a proportional drive so that the SSD appears the same as the HDDs included in the enclosure. Rather, it is a smaller drive actually associated with the controller hardware, like the SRAM or DRAM memory used to cache the hosted write operations. This appears slightly different in the implementations of the controller management, because more information may need to be provided to the controller to appropriately route the host-read operation data to the memory component. However, once data blocks are cached in this form of memory, it can again take advantage of the operational differences such as lower latency, that is the faster operational speed of the solid-state component.

Figure 4:
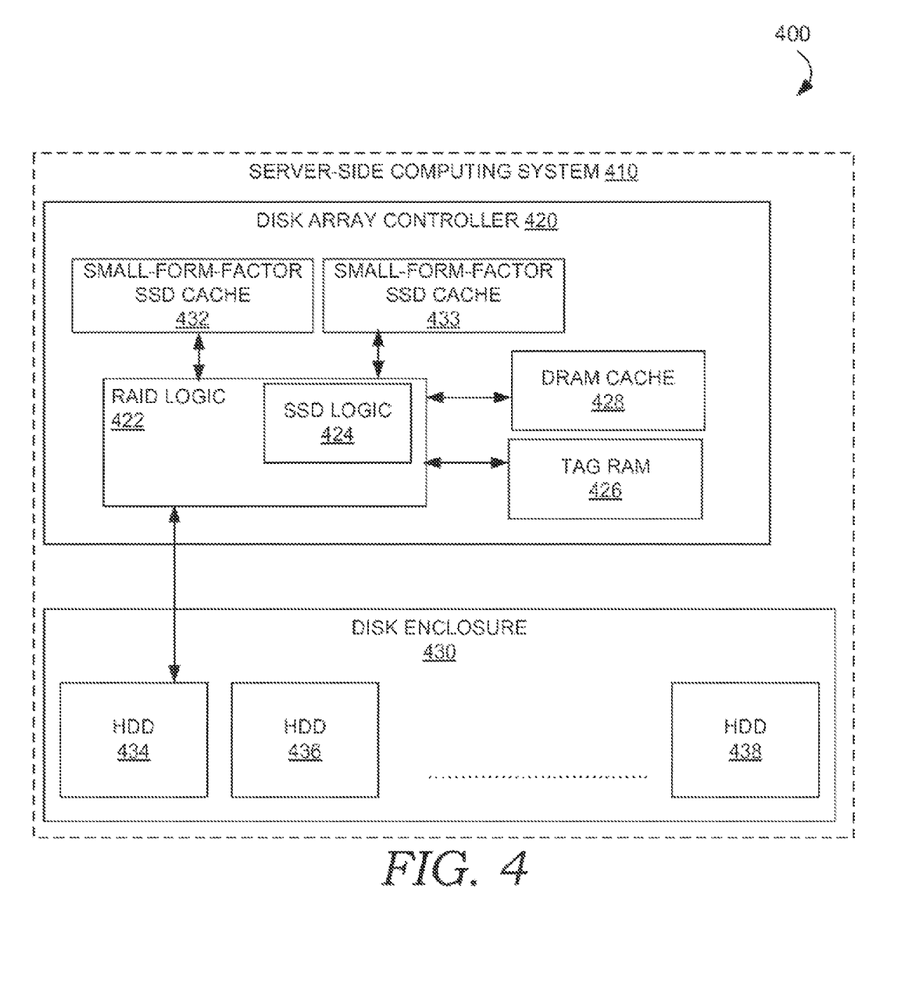
FIG. 4 is a block diagram of an embodiment of the invention with a controller-situated, small-form-factor SSD cache.

Now turning to FIG. 4, which is a block diagram of embodiments of the invention, a controller-situated, small-form-factor SSD cache is illustrated. Many of the same elements are shown, such as server-side computing system 410, RAID controller 422, solid-state cache memory component 424, TAG RAM 426, and DRAM cache 428. These are all understood to be part of a disk array controller 420, again mostly analogous to the system shown in FIG. 3. Not shown for the sake of brevity are the network and various computing devices accessing disk array controller 420.

A disk enclosure 430 is shown, but one that only has a plurality of hard disk drives numbered 434 to 438. Instead of a large-form factor SSD drive as previously shown in FIG. 3, the illustrated embodiment has small-form factor SSDs 432 and 433 located directly on disk array controller 420. This represents a departure from the embodiments of FIG. 3 in two respects. As the SSDs would not be a proportional scale to the HDDs, the amount of memory and therefore performance enhancement that could take place would be reduced. Likewise, SSDs 432 and 433 would not appear on the server rack and would be tied to the adapters or cards used to control the array. Therefore, standard drives slots would likely not be used, in this case more drive slots are available for future storage expansion.

There are yet other embodiments that are possible given the various types of storage controllers that have been developed. There are embodiments contemplated that use RAID on Chip (ROC) technology and two configurations for the TAG RAM used for the TAG array. The TAG RAM can either be external to the ROC controller, or embedded as a subcomponent of the controller. In either instance, a small-form-factor SSD is used as the data cache. The ROC controller, with or without embedded TAG RAM for host read operations, communicates with the SSD for caching purposes.

Figure 5:
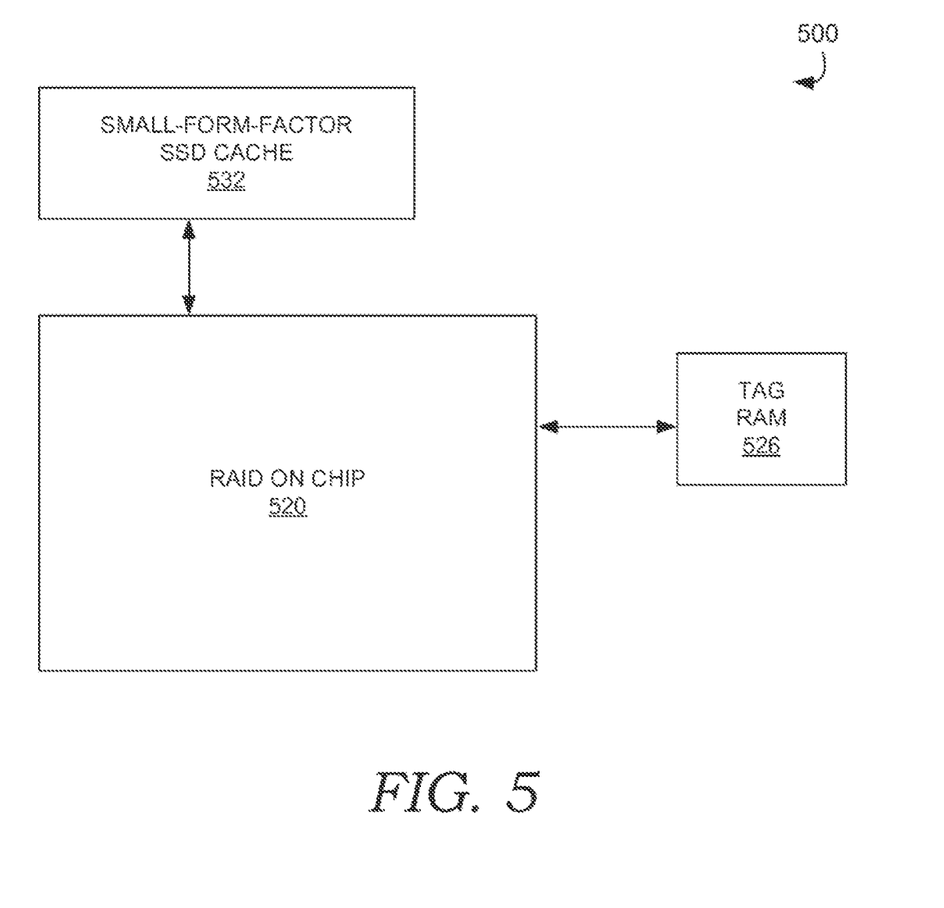
FIG. 5 is a block diagram of an embodiment of the invention utilizing RAID-on-Chip control and external TAG Random Access Memory (RAM) for an SSD cache.
Figure 6:
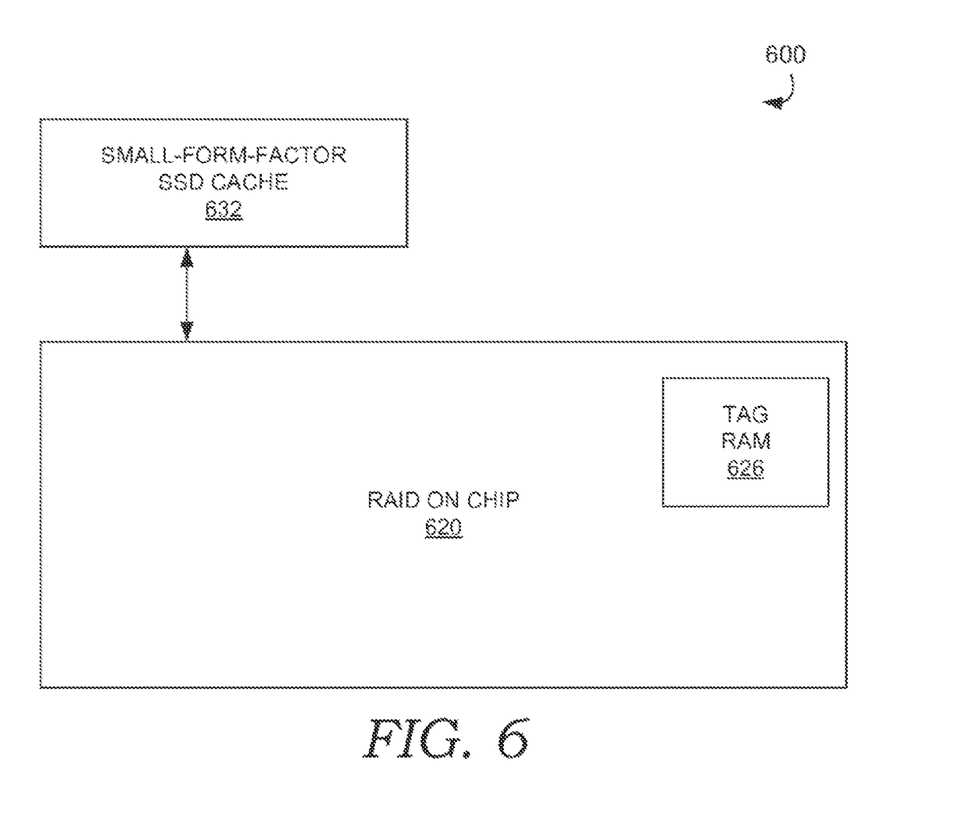
FIG. 6 is a block diagram of an embodiment of the invention utilizing RAID-on-Chip control and an embedded TAG RAM for an SSD cache.

FIG. 5 is a block diagram 500 of an embodiment of the invention utilizing RAID-on-Chip (ROC) control and external TAG Random Access Memory (RAM) for an SSD cache. Rather than the entire system shown in previous figures, a ROC implementation contains nearly all that is needed for redundant arrays on a single chip. A ROC controller 520 is shown. ROC controller 520 is in communication with a TAG RAM 526 that is externally provided. ROC Controller 520 is also in communication with SSD 532, which is again a small form factor cache. FIG. 6 is a similar block diagram 600 utilizing RAID-on-Chip control and an embedded TAG RAM for an SSD cache. A TAG RAM 626 is shown that is a component of a ROC controller 620. Again, ROC controller 620 is in communication with a small-form-factor SSD cache 632 as seen in FIG. 5.

In accordance with the above described apparatus and systems, methods for hybridizing cache memory of a hosted computer system are provided. A first method using only one level of caching includes, among other things, a storage controller receiving a request for a hosted computing operation. The storage controller consults a memory array associated with a cache memory to determine if a cache hit or cache miss occurs. If a cache hit is returned, it is determined if the request is for a host-read or a host-write operation. If a write operation is requested, the tag is invalidated. As a result of the invalid tag, the controller communicates with a rotating magnetic hard disk to store the requested data block conventionally. If a cache hit is returned and a hosted-read operation is requested, the data block is retrieved from a solid-state memory component such as a flash-based SSD.

If a cached copy of the requested data block is not indicated, i.e. there is a cache miss, the determination is still made as to the whether or not the operation is a hosted-read operation or a hosted-write operation. In the event of a cache miss with a hosted-read operation, the data block is retrieved from a magnetic disk memory component and the data block is copied to the solid-state memory component. A cache miss with a hosted-write operation results in writing the data block to a magnetic disk memory component.

A second method utilizes two levels of caching, but shares a number of steps with a one-level method. In this scenario, a first cache that is RAM-based is checked first for a cache hit or miss. With a cache hit, determination is still made as to the type of operation requested. But, both hosted-read operations and hosted-write operations are supported by the RAM-based cache as it does not experience data endurance issues. Determination is simply to discover what operation to perform. When a first-level cache miss is characterized, the method moves to a second-level cache, which is solid-state cache. From that point, remainder of the method mirrors the one-level caching method described above.

Figure 7:
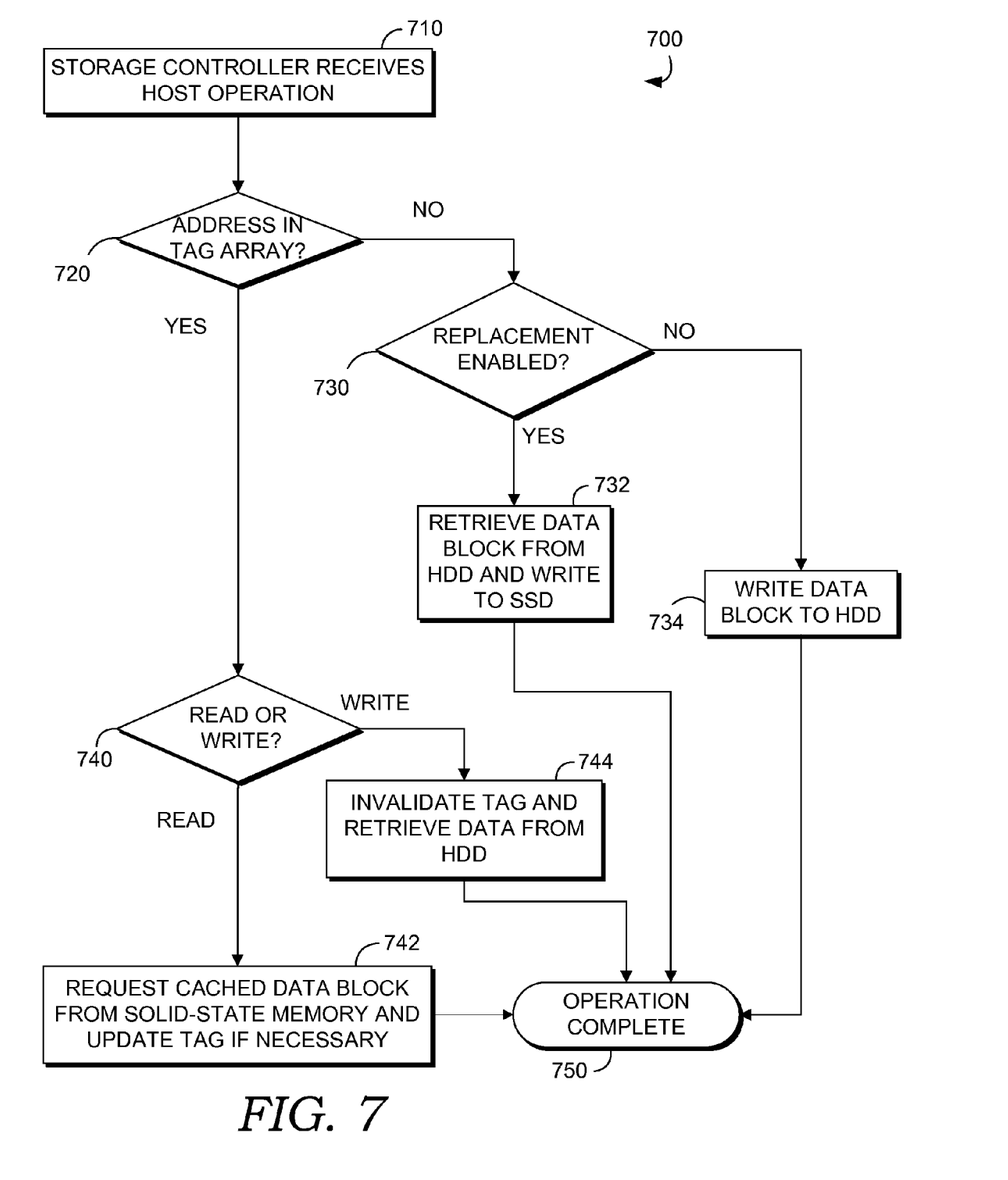
FIG. 7 is a flowchart representing a computer-implemented method for hybridizing cache memories of a hosted computer system.

FIG. 7 is a flowchart representing a computer-implemented method 700 for hybridizing cache memory of a hosted computer system. Method 700 includes a storage controller receiving a request for a host-read operation or a host-write operation at a step 710. Again, the storage controller could be a disk array controller, such as a RAID controller or RAID on Chip (ROC) controller. Alternatively, the storage controller could be a super I/O controller, an embedded Serial ATA controller, or any one of a number of other storage controllers available.

The storage controller determines if the request is for an address stored in the TAG array at a step 720. If there is a cache miss, i.e. there is no match stored in the TAG array, one set of actions is taken, while if there is a cache hit another set of steps is taken. At a step 730, if a cache miss occurs, the controller determines if replacement is enabled. If replacement is enabled, at a step 732 the data block is retrieved from an HDD and written to the SSD. If it is not enabled, the controller communicates with the hard drive to write the data block to the HDD at a step 734. Once these actions take place, the operation is complete at a step 750.

If a cache hit occurs, however, the controller communicates with a solid-state cache memory controller at a step 740. The solid-state cache memory controller determines if the hosted operation is a hosted-read operation or a hosted-write operation. If the operation is a hosted-write operation, the tag is invalidated and the data block is retrieved from a HDD at a step 744. If that occurs, then the operation is complete at a step 750. If the hosted operation is a hosted-read operation at step 740, at a step 742 the data block cached in the solid-state memory is requested. The tag used for that cache hit is updated, if necessary, and the operation is again complete at step 750.

There can be two levels of caching as seen previously in FIG. 3. If a conventional RAM-based cache is available in addition to SSD caching, a different method is needed. With two levels, if a cache hit occurs at the first level, i.e. the RAM-based cache, then either read or write operations can occur. If a cache miss is the result at the first level, the second level operates as previously described with reference to FIG. 7. Thus, the second-level cache, in effect, becomes an overflow cache used only for hosted-read operations.

Figure 8:
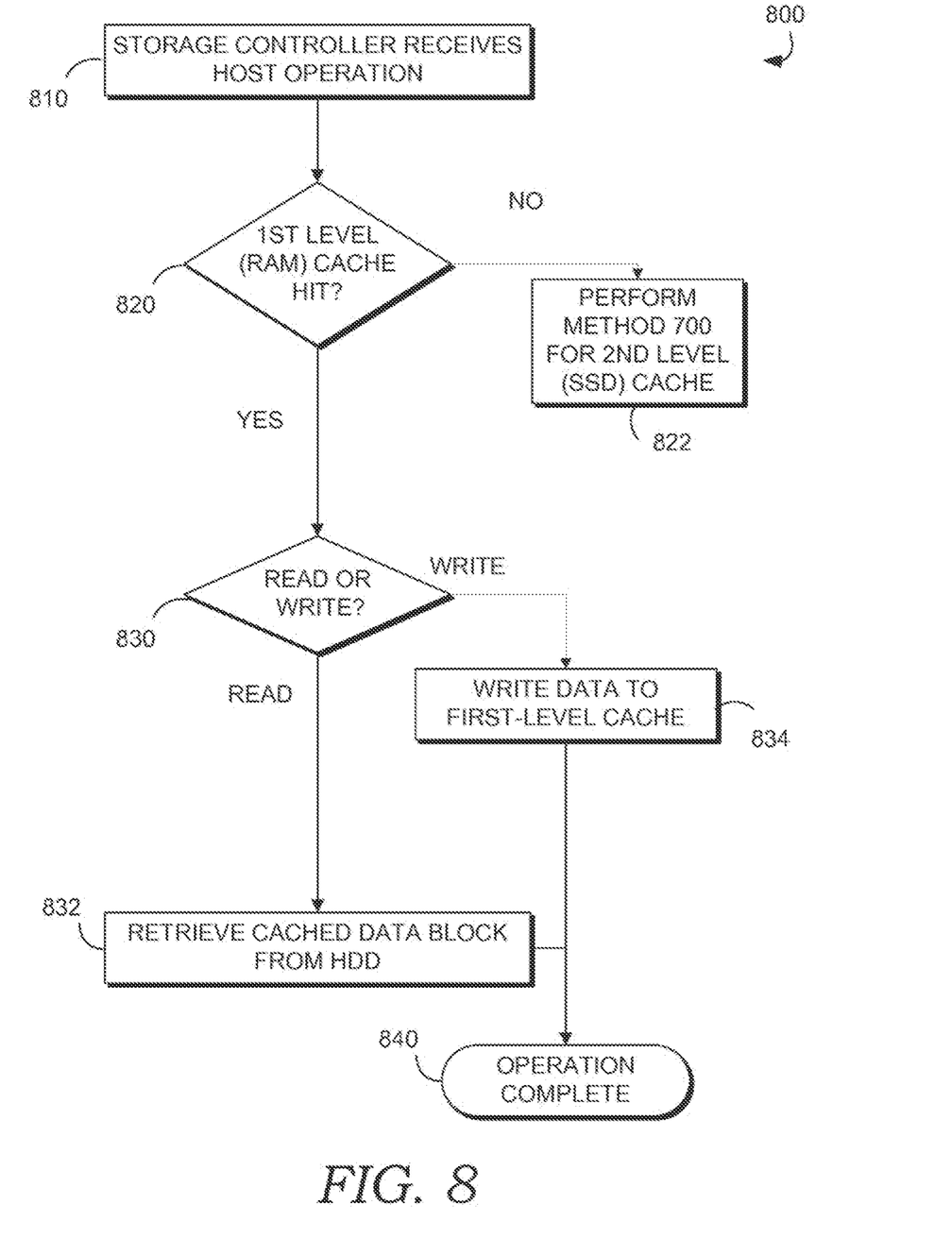
FIG. 8 is a flowchart representing a computer-implemented method for hybridizing two-level cache memories of a hosted computer system.

FIG. 8 is a flowchart representing a computer-implemented method 800 for hybridizing two levels of cache memory of a hosted computer system. At a step 810, a storage controller receives a hosted-operation. At a step 820, it is determined if there is a cache hit on the first level, that is whether or not the RAM-based cache has a hit. If the first-level cache has a cache miss at step 820, the entire method 700 is performed for the second-level (SSD) cache at a step 822. If there is a cache hit, however, the method continues at a step 830 with a determination of whether the hosted-operation is a host-read operation or a host-write operation.

If there is a cache hit and the data block is to be read, the data block is retrieved from RAM-based cache at a step 832. At a step 834, hosted-write operations with a first-level cache hit result in write updating the data in the RAM-based cache. Step 832 and step 834 result in completion of the operation at a step 840.

The described embodiments can be used in a "hot plug-gable" manner, which is to say that storage components may be added or removed without complete shutdown of the system. The ability to accomplish hot-pluggable events is in part because of the redundancy of a drives and inherent failover of data such a configuration provides. However, every time there is a system boot up or a hot-plug event, discovery must occur as to whether hybridized caching is available. Discovery of hybridized caching can be accomplished by determining the presence or absence of SSDs, determining controller support for SSD caching, and initializing the caches tags used for SSD caching.

Because the controller will see the one or more SSD caches as a complete proxy for the set of HDDs (i.e. every address in the HDDs will need to be addressable to the cache memory), cache tags will need to be initialized at each event. For example, take the situation in which one SSD is used to cache 10 HDDs. Assuming for the sake of simplicity an equal sized SSD with the HDDs, each SSD block will represent 10 HDD data blocks. The total SSD size and block size will determine the total number of cachelines. If a second SSD is added to increase the caching capabilities, but the block size has not changed, the number of cachelines will be doubled. Therefore, the number of HDD data blocks per SSD data block will be cut in half. This results in a need for the solid-state cache control component to initialize the tags in the tag array each time the cache memory components or primary memory components are added or removed.

Figure 9:
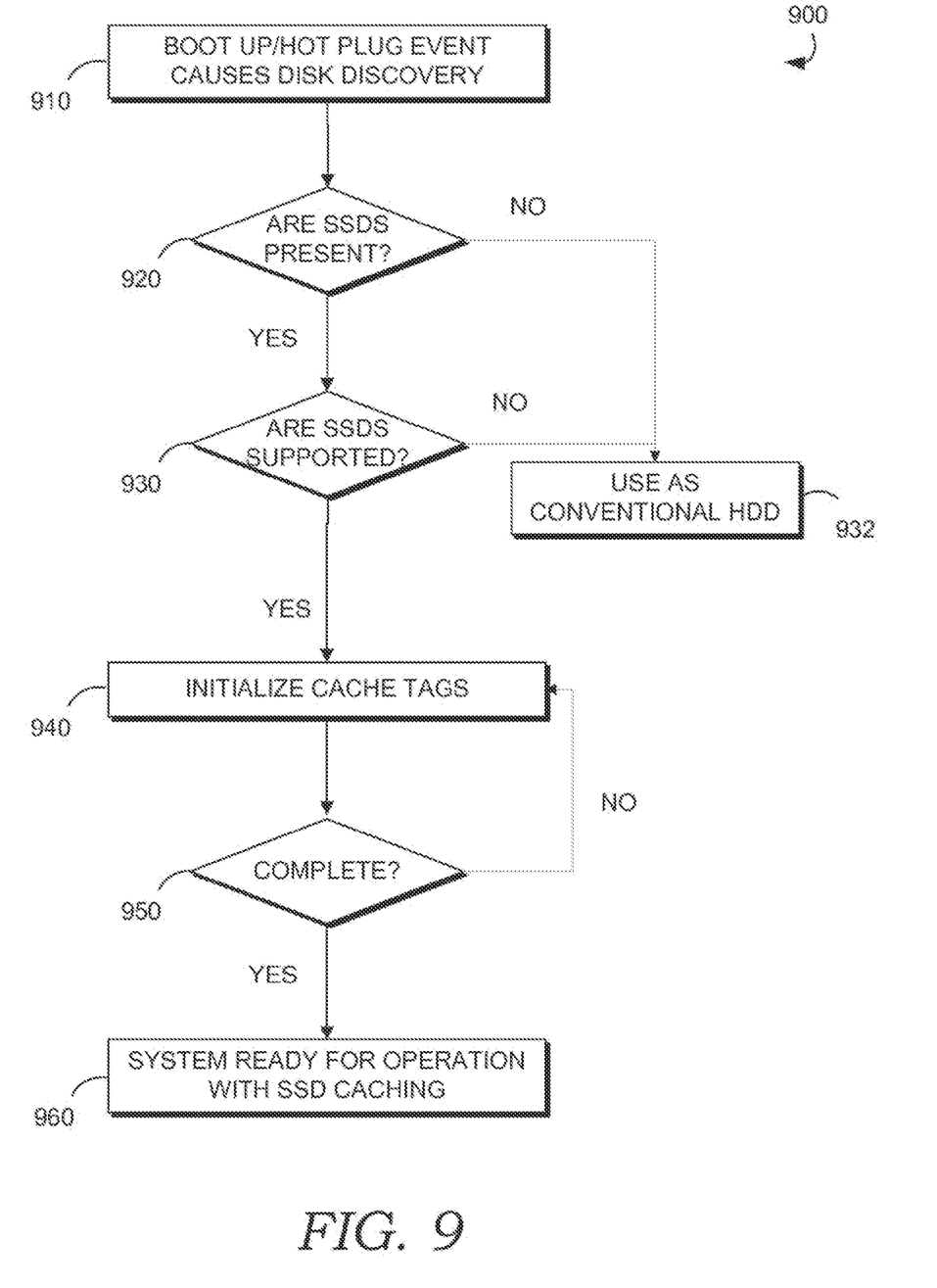
FIG. 9 is a flowchart representing an initialization sequence for a computing system using a hybridized caching system.

FIG. 9 is a flowchart representing an initialization sequence 900 for a computing system using a hybridized caching system. At a step 910, a boot up or hot-plug event causes controller disk discovery to begin. At a step 920, discovery detects the presence or absence of one or more SSDs. These could be any of the configurations discussed previously, such as the drive-enclosure included SSDs, those located on the controller apparatus, or those located on a ROC controller implementation.

If no SSD is detected, the normal HDD detection takes place at a step 932. If one or more SSDs are detected, a determination as to whether or not the controller supports SSD caching is performed at a step 930. This determination can be carried out according to industry standard or protocol-based discovery methods. Standards that would enable this include the above mentioned ATA, SATA, SCSI, Fibre Channel, or SAS protocols. The solid-state cache controller could be a separate component discoverable by the RAID controller. This could also be a subcomponent of a RAID controller that is discoverable by the operating system. There are other embodiments that are possible, depending on the configuration of the computing system and the specifics of the hardware. If the controller does not support SSD caching, again the method continues at step 932 by using as a normal HDD.

If the controller does support SSD caching, at a step 940 the cache tags are initialized. The controller continues to monitor the process of initializing the tags at a step 950. If the initialization is not complete, monitoring continues in a loop. Once the tags are initialized at step 950 the method concludes at a step 960, when the system is ready for operation.

Embodiments of the invention, which are intended in all respects to be illustrative rather than restrictive have been described. Alternative embodiments will become apparent to those of ordinary skill in the art without departing from its scope. From the foregoing, it will be seen that embodiments of the invention one well-adapted to attain all the ends and objects set forth above, together with other advantages which are obvious and inherent to the system and method. It will be understood that certain features and sub-combinations are of utility and may be employed without reference to other features and sub-combinations. This is contemplated by and is within the scope of the claims.

The technology claimed is:

1. A method for hybridizing cache memory having at least one magnetic media and at least one solid-state media, the method comprising:
   receiving a read request to retrieve a data block;
   checking whether the at least one solid-state media is available to fulfill the read request;
   when the at least one solid-state media is able to fulfill the read request, completing the read request without utilizing the magnetic media; and
   when the at least one solid-state media is unable to fulfill the read request, substantially simultaneously performing both of the following:
   (1) completing the read request at the at least one magnetic media; and
   (2) updating the solid-state media with the data block retrieved from the at least one magnetic media.

2. The method of claim 1, wherein the at least one solid-state media is a non-volatile memory.

3. The method of claim 1, wherein the request includes at least a LBA number and an operand size that denotes the size of a data block request.

4. The method of claim 1, wherein a data block is returned by a disk array controller in response to the read request.

5. One or more hardware computer-storage media devices having computer-executable instructions embodied thereon that, when executed by a computing device, perform a method for hybridizing cache memory of a serving computer system, the method comprising:

receiving, at a Redundant Array of Inexpensive Disks (RAID) storage controller in communication with at least a solid state cache control logic component and an associative memory component, a request for a hosted computing operation to retrieve a data block;

consulting a memory array associated with a cache memory component, by the storage controller, to determine if a cache hit or cache miss occurred:

when a cache hit occurs, determining, by a solid-state cache memory controller, if the request is for a hosted-read operation or a hosted-write operation, wherein if the request is a hosted-read operation, retrieving the data block from a solid-state cache memory component; and when a cache miss occurs, determining, by the solid-state cache memory controller, if the request is for a hosted-read operation or a hosted-write operation, wherein if the request is a hosted-read operation, retrieving the data block from a magnetic-disk memory component, and completing the hosted-read operation request and copying the data block to the solid-state cache memory component on a first read access operation.

6. The media of claim 5, wherein the solid-state cache memory component is located remotely from the solid-state cache control component.

7. The media of claim 5, wherein the solid-state cache memory component is a non-volatile memory.

8. The media of claim 5, wherein one or more additional solid-state cache memory components can be added without disruption to the host computing system.

9. The media of claim 5, wherein the solid-state cache controller is one of an external controller communicating with the storage controller, an embedded component within the storage controller, or a controller within a plurality of controllers manipulated by a centralized controller.

* * * * *